(12) United States Patent
Griffiths et al.

(10) Patent No.: US 7,795,980 B2
(45) Date of Patent: Sep. 14, 2010

(54) POWER AMPLIFIERS HAVING IMPROVED PROTECTION AGAINST AVALANCHE CURRENT

(75) Inventors: James R. Griffiths, Chandler, AZ (US); David M. Gonzalez, Mesa, AZ (US); Elie A. Maalouf, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 110 days.

(21) Appl. No.: 12/138,959

(22) Filed: Jun. 13, 2008

(65) Prior Publication Data

US 2009/0309663 A1 Dec. 17, 2009

(51) Int. Cl.
H03F 1/52 (2006.01)
(52) U.S. Cl. .................... 330/298; 330/288; 330/296
(58) Field of Classification Search .......... 330/285, 330/288, 296, 298, 207 P
See application file for complete search history.

(56) References Cited

U.S. PATENT DOCUMENTS

| 4,008,441 | A | 2/1977 | Schade, Jr. | |
|---|---|---|---|---|
| 4,656,434 | A | 4/1987 | Selin | |
| 6,208,202 | B1 | 3/2001 | Kaufman et al. | |
| 6,362,685 | B1 | 3/2002 | Vagher | |
| 6,720,831 | B2 | 4/2004 | Dening et al. | |
| 6,753,734 | B2 * | 6/2004 | Arell et al. | 330/296 |
| 6,806,768 | B2 | 10/2004 | Klaren et al. | |
| 6,825,727 | B1 | 11/2004 | Hill | |
| 6,977,554 | B2 | 12/2005 | Sung et al. | |
| 7,183,843 | B1 | 2/2007 | Jones et al. | |
| 7,365,604 | B2 * | 4/2008 | Luo et al. | 330/296 |
| 7,609,113 | B2 * | 10/2009 | Davenport | 330/296 |

OTHER PUBLICATIONS

Rujis, L., et al., Novel Voltage Limiting Concept for Avalanche Breakdown Protection, IEEE, 0-7803-9542-May 2006 pp. 1842-1845.
Kim, Chang-Woo, Monolithic SiGe HBT Feedforeard Variable Gain Amplifiers for 5 GHz Applications, ETRI Journal, vol. 28, No. 3, pp. 386-388, Jun. 2006.
Shin, H, et al., Monlithic SiGe HBT Handset Power Amplifier with Robuse Output VSWR Surge Protection, Electrical Engineering Department, University of California, Los Angeles, CA.

* cited by examiner

*Primary Examiner*—Khanh V Nguyen
(74) *Attorney, Agent, or Firm*—Ingrassia, Fisher & Lorenz, P.C.

(57) ABSTRACT

A power amplifier for use in a radio frequency (RF) transmitter or other device exhibits improved protection from voltage standing wave ratio (VSWR) issues emanating from avalanche currents. The amplifier circuit includes a power transistor having a base terminal, and a mirror transistor having a collector terminal and a base terminal. The base terminal is coupled to the collector terminal of the mirror transistor to thereby provide a bias current to the base terminal of the mirror transistor. The base terminal is also coupled to the base terminal of the power transistor to thereby form a base bias feed node for a current mirror arrangement. A static or variable impedance is coupled to the base bias feed node to sink current and to thereby maintain the proper bias current at the base terminal of the mirror transistor to thereby continue operation of the mirror transistor while avalanche conditions exist.

23 Claims, 4 Drawing Sheets

POWER AMPLIFIERS HAVING IMPROVED PROTECTION AGAINST AVALANCHE CURRENT

TECHNICAL FIELD

Embodiments of the subject matter described herein relate generally to power amplifiers such as those used in wireless phones and other radio frequency transmitters. More particularly, various embodiments relate to power amplifier circuits with protection from avalanche currents such as those experienced during operation at relatively high voltage standing wave ratios.

BACKGROUND

"Amplifiers" are any devices, circuits or systems capable of converting an input signal into an output signal with an increased energy level. Amplifier circuits and systems are used in many different applications. Conventional mobile phones, for example, commonly incorporate power amplifier systems to amplify radio frequency (RF) signals that are transmitted from the phone to a base station or other receiver. Generally, amplifier systems include any number of transistors or other non-linear gain elements that are capable of increasing an electrical current or voltage representing the input signal. Certain types of transistors that have experienced widespread use in many amplifier systems include the bipolar junction transistor (BJT) and the hetero-junction bipolar transistor (HBT). Many different types of transistors have been formed in silicon, silicon germanium (SiGe), gallium arsenide (GaAs) and other materials, as is well understood in the art.

As a skilled radio frequency (RF) designer can attest, maximal power transfer from an amplifier (or other source of power) to a load generally occurs when the impedances of the source and load match. If impedances do not match, some of the power produced by the source can be reflected back to the source rather than being delivered to the load. Hence, it is generally desirable to match the impedance of a source (e.g., a power amplifier) to the impedance of a load (e.g. an RF antenna). Impedance matching can be complicated, however, by environmental effects such as the presence of nearby conductive objects that can create standing electromagnetic waves. One measure of system performance, then, is the voltage standing wave ratio (VSWR), which is related to the ratio of the power sent forward from the amplifier to the amount of power that is reflected back from the antenna or other load due to standing waves and the like.

Conventional silicon BJTs and HBTs generally have not been widely deployed as power amplifiers used in wireless telephony due to well-known ruggedness issues related to high VSWR conditions. In particular, conventional silicon BJT and HBT devices have been known to generate "avalanche" currents in response to relatively high VSWR conditions that can occur in wireless communication environments. Avalanche currents typically result when an electric field (such as the field produced in an RF transmitter) accelerates free electrons in a semi-conducting material; the accelerated electrons, in turn, can accelerate other electrons, ultimately leading to rapidly increasing currents in undesired pathways. These parasitic currents, in extreme cases, could lead to destruction of the transistor, thereby rendering the power amplifier (and the telephone or other device) inoperable. Although avalanche currents typically occur at lower voltages in silicon devices, they are also know to occur in GaAs and other devices as well.

Many attempts have been made to address the ruggedness issues associated with BJT and HBT amplifiers operated in high VSWR environments. Generally, engineers have attempted to avoid avalanche conditions entirely by controlling the output of the amplifier. This may be accomplished, for example, with suitable ballast circuitry and/or diode clamping, or by simply detecting when VSWR issues may occur and reducing power to the amplifier at such times. Each of these schemes has met with limited success, at best. At the very least, none of the techniques attempted in the past address the root cause of the ruggedness issues, so their usefulness has been somewhat limited. Hence, silicon bipolar and HBT devices have not been widely used in wireless telephony amplifiers and in other applications in which relatively high VSWR conditions can occur.

Accordingly, it is desirable to provide amplifier circuits and techniques that improve the ruggedness of the amplifier without the adverse effects that may have been experienced in the past. Other desirable features and characteristics will become apparent from the subsequent detailed description and the appended claims, taken in conjunction with the accompanying drawings and the foregoing technical field and background.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
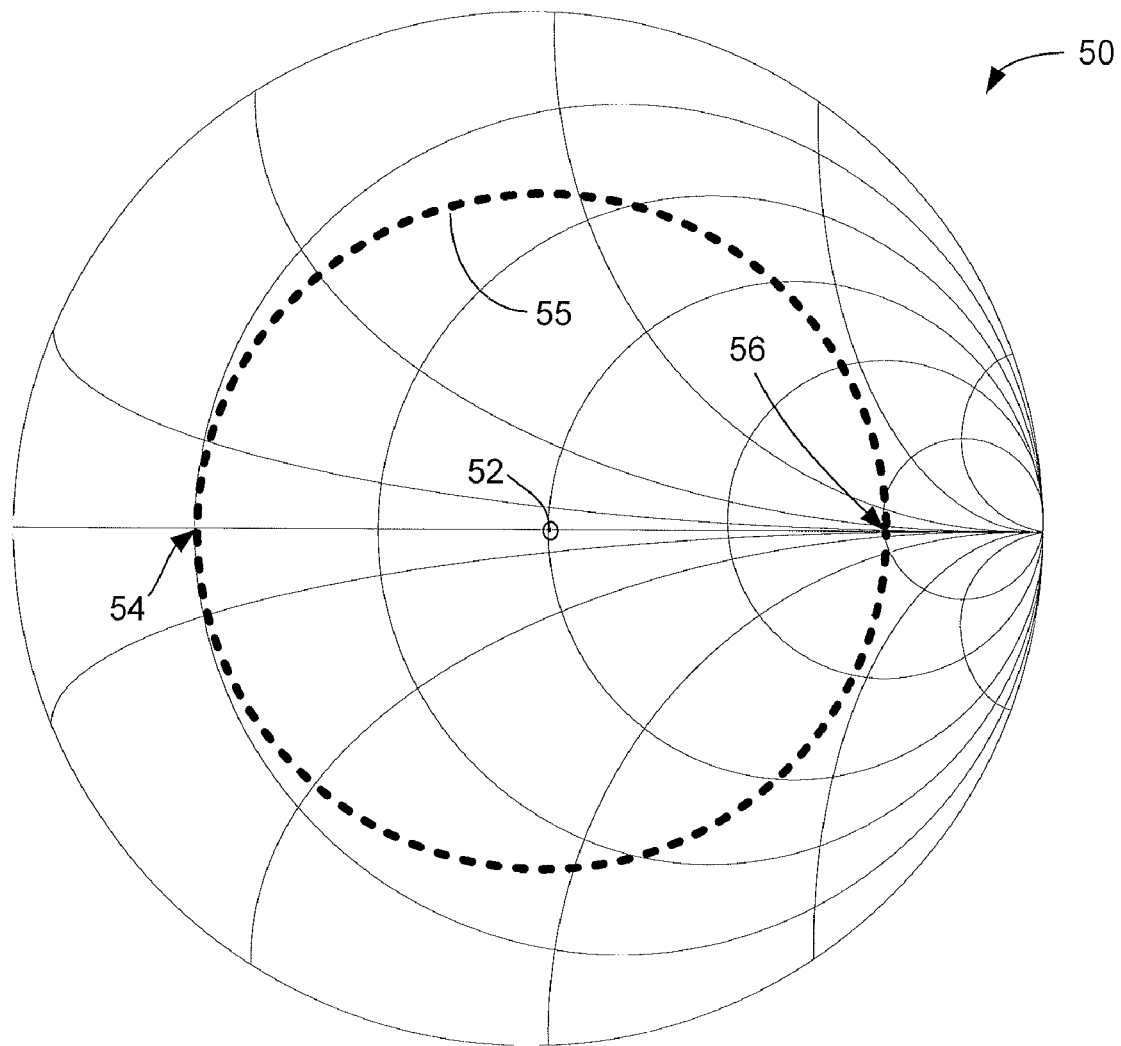
FIG. 1 is a Smith chart showing a VSWR circle for an exemplary power amplifier.

The following detailed description is merely illustrative in nature and is not intended to limit the embodiments of the subject matter or the application and uses of such embodiments.

According to various embodiments, systems, circuits and methods are described for improving the ruggedness of power amplifiers during high voltage and/or high VSWR operation when avalanche currents may be generated. For a power amplifier that is based upon a current mirror arrangement, it has been identified that device breakdown typically results when avalanche currents overwhelm the bias currents flowing into the base terminal of the mirror transistor, thereby shutting down the mirror circuit. Various embodiments therefore provide a current sink feature that allows avalanche currents to exit the amplifier circuit, thereby maintaining the proper bias current in the mirror transistor and allowing the mirror transistor to continue operating despite the presence of avalanche current. Rather than resorting to limits or controls on amplifier output, then, the root cause of device breakdown can be addressed within the bias circuit for the device.

The current sink may be implemented in any manner. In a simple embodiment, a shunt resistor or similar impedance can provide a current sink to ground or another suitable node for avalanche currents produced within in the current mirror circuit. In other embodiments, a current sink can be implemented as a variable impedance (e.g. a transistor or variable resistance) provided between the common base junctions of the mirrored transistors and ground (or another reference). The impedance can be adjusted to be a low impedance when avalanche currents are likely to appear to permit avalanche current to exit the system, thereby preserving the bias current to the mirror transistor, which in turn keeps the mirror circuit operating even when avalanche current is present. By keeping the mirror transistor operating during avalanche conditions, device breakdown can be avoided. The impedance can be correspondingly increased when avalanche currents are unlikely to appear to reduce any effects of the current sink upon battery current drain.

These and other features of the various embodiments are described in great detail in conjunction with the various drawing figures below. Before turning to the other drawing figures, however, it is helpful to provide additional information about several of the terms used in this document.

As used herein, the word "exemplary" means "serving as an example, instance, or illustration", rather than as a "model" that would be exactly duplicated. Any implementation described herein as exemplary is not necessarily to be construed as preferred or advantageous over other implementations. Furthermore, there is no intention to be bound by any expressed or implied theory presented in the preceding technical field, background, brief summary or the following detailed description.

As used herein, the term "substantially" is intended to encompass any slight variations due to design or manufacturing imperfections, device or component tolerances, environmental effects and/or other factors. The term "substantially" also allows for variation from a perfect or ideal case due to parasitic effects, noise, and other practical considerations that may be present in an actual implementation.

The following description may refer to elements or nodes or features being "connected" or "coupled" together. As used herein, unless expressly stated otherwise, "connected" means that one element/node/feature is electrically, mechanically, logically or otherwise directly joined to (or directly communicates with) another element/node/feature. Likewise, unless expressly stated otherwise, "coupled" means that one element/node/feature may be mechanically, electrically, logically or otherwise joined to another element/node/feature in either a direct or indirect manner to permit interaction even though the two features may not be directly connected. That is, "coupled" is intended to encompass both direct and indirect joining of elements or other features, including connection with one or more intervening elements.

In addition, certain terminology may also be used in the following description for the purpose of reference only, and thus are not intended to be limiting. For example, the terms "first", "second" and other such numerical terms referring to structures or elements do not imply a sequence or order unless clearly indicated by the context.

For the sake of brevity, conventional techniques related to power amplifier design, variable impedances, variable gain elements, wireless transmitters, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

Details of several exemplary embodiments will now be presented with particular reference to the drawing figures.

FIG. 1 shows a conventional Smith chart 50 showing various operating conditions centered around an optimal load impedance 52 for a power amplifier. The particular optimal impedance 52 shown in FIG. 1 may be any value depending on the particular embodiment; a conventional power amplifier used in wireless telephony may have an optimal impedance on the order of three ohms or so, for example, although other embodiments may have widely different values. As with any Smith chart, real impedance (e.g., resistance) is plotted horizontally, with imaginary impedance (e.g., capacitance, inductance) plotted vertically in FIG. 1.

Because wireless telephones and other devices may be operated in many different environments (e.g., as the user moves from location to location), it is generally desirable to design the device to operate across a range of demanding conditions. Circle 55 in FIG. 1 therefore represents a range of impedances that may be experienced at a particular VSWR. To that end, it is generally desirable in some embodiments to design the amplifier or other device to operate under any load impedance that may occur within the circle 55. The particular radius of circle 55 is somewhat arbitrary, and may increase or decrease depending upon the particular design. A maximum VSWR of about three to five, for example, may be appropriate for many RF power amplifier applications, although other embodiments and applications may use circles of greater or lesser radius corresponding to whatever VSWRs are to be addressed.

As a skilled RF engineer will appreciate, the most extreme operating conditions shown in FIG. 1 correspond to points 54 and 56 on circle 55, which correspond to the lowest and highest impedances (respectively) within the operating range of the device. Hence, these two points 54 and 56 are of particular interest in designing an amplifier or the like. Point 54 approaches a short circuit condition wherein the output current in a bipolar transistor is at its greatest value. Although various values of short circuit load voltage capability ($V_{ces}$) can vary greatly in different devices, exemplary values may be on the order of about fifteen volts in silicon devices and about twenty-five volts in gallium arsenide. Point 54 is typically a high-current condition that results from temperature variations or other factors. As described more fully below, base and/or emitter ballasting can be used to compensate for the high current, and thereby provide effective operation of the device under such conditions.

Point 56 in FIG. 1 represents a high-impedance, approaching open circuit condition wherein the output voltage (e.g., the collector-emitter voltage in a bipolar device) is at its highest value. An exemplary value of voltage $V_{ceo}$ may be on the order of about six volts in a silicon device, for example, and about fifteen volts in a gallium arsenide device, although these values may differ in other embodiments. Operation at point 56 typically produces relatively high collector voltage in bipolar devices, which can result in undesirable avalanche currents as described above. Hence, operation at point 56 is of primary concern in designing a power amplifier or other system that is able to withstand relatively high VSWR conditions. This may be accomplished, for example, by ensuring that the bias voltage applied within the power amplifier system is maintained under control even when avalanche conditions occur.

Figure 2:
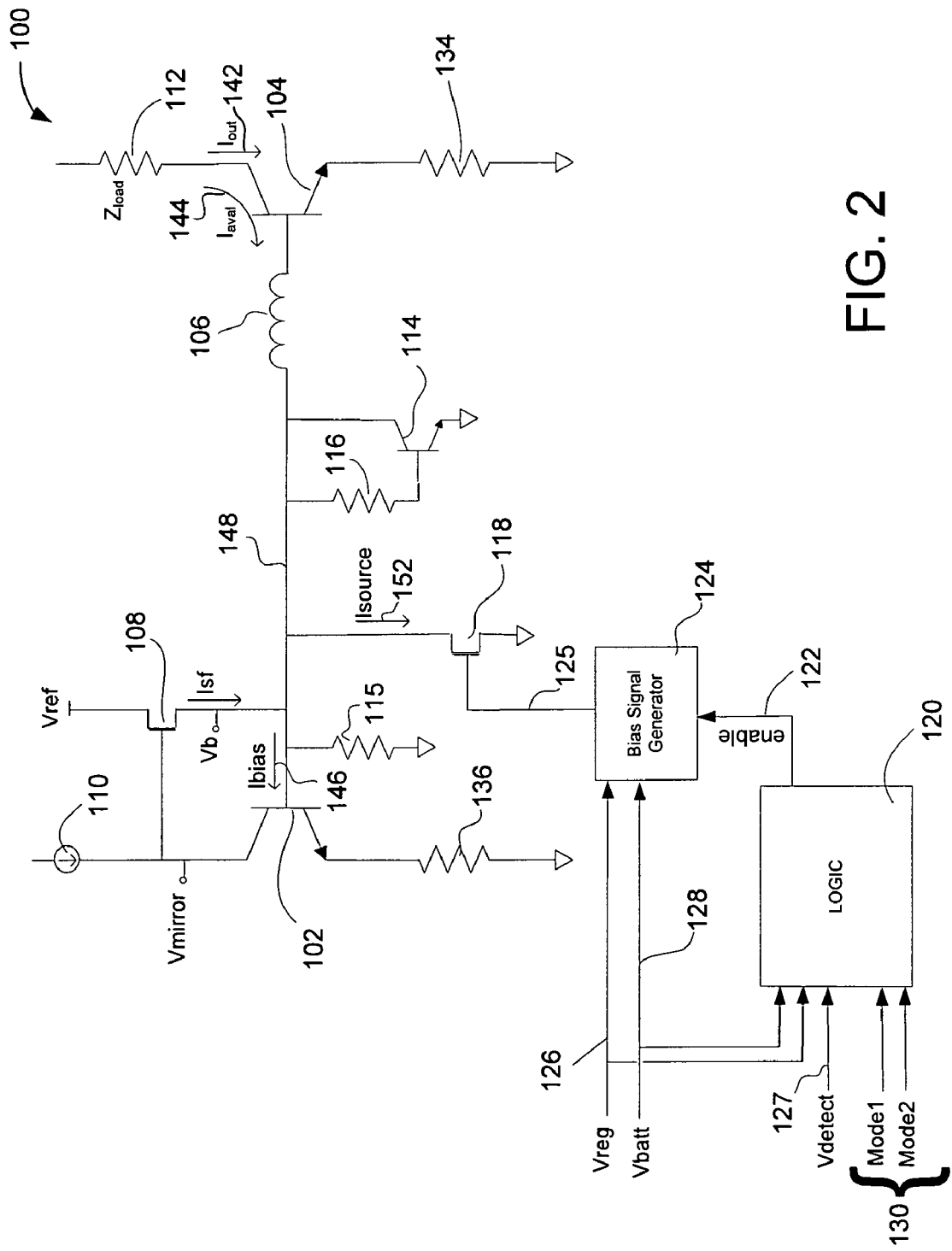
FIG. 2 is a circuit diagram of an exemplary power amplifier circuit that includes several different examples of current sink features.

An exemplary power amplifier system 100 that is able to operate even under relatively high VSWR conditions is shown in FIG. 2. After introducing the various components of system 100, additional information about the principles underlying bias control and operation of the power amplifier system will be presented below with respect to FIGS. 3-6, which represent various operating conditions of system 100.

Referring now to FIG. 2, an exemplary amplifier circuit 100 suitably includes two or more transistors 102, 104 configured in a conventional current mirror arrangement to provide current ($I_{out}$) 142 to an antenna or other load 112. Transistors 102 and 104 may be any type of transistors, including any type of PNP or NPN bipolar junction or hetero-junction bipolar transistors formed from silicon, silicon germanium (SiGe), gallium arsenide (GaAs) and/or other materials, as desired. In the example shown in FIG. 2, transistor 102 is a mirror transistor 102 with a base bias feed node 148 that is coupled to the base terminal of power transistor 104, and with feedback provided from the collector terminal to the base terminal, in accordance with conventional current mirror design. FIG. 2 shows current provided from a source 110 (which may be, for example, derived from a battery or other known voltage applied across a resistor or other impedance through simple application of Ohm's Law), which is applied to the collector of mirror transistor 102. The exemplary embodiment of FIG. 2 also shows a follower amplifier 108 (e.g., a voltage follower) that level shifts the voltage from the collector junction to the base junction of mirror transistor 102. Although shown as a source-following field effect transistor (FET) amplifier in FIG. 2, amplifier 108 could be equivalently implemented with an emitter-following BJT or the like. Further, other embodiments of amplifier circuit 100 may include additional transistors or other elements, and/or may replace the NPN-type transistors 102 and 104 with PNP-type or other types of transistors (including metal oxide semiconductor (MOS) devices or the like), and/or may be differently configured in any other manner.

As noted above, certain operating conditions (e.g., high VSWR conditions and high output power) may produce undesirable avalanche currents 144 in power transistor 104. This avalanche current 144 can, under certain conditions, flow through a common base bias feed node 148 that couples to the base terminals of both transistors 102 and 104, and may ultimately overwhelm the bias current ($I_{bias}$) 146 provided to the base of transistor 102, effectively shutting off transistor operation. This, in turn, would have the effect of shutting down the follower amplifier 108, which then shuts down current mirroring in circuit 100 and turns the bias network into a high impedance, as seen from the base of power transistor 104.

Figure 3:
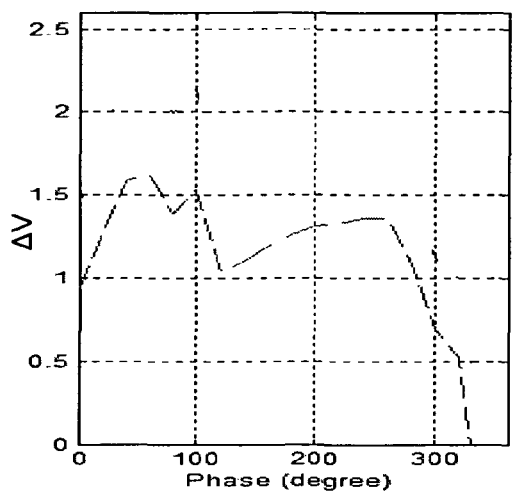
FIGS. 3 and 4 are plots of exemplary voltage and current characteristics, respectfully, observed without current sinking.
Figure 4:
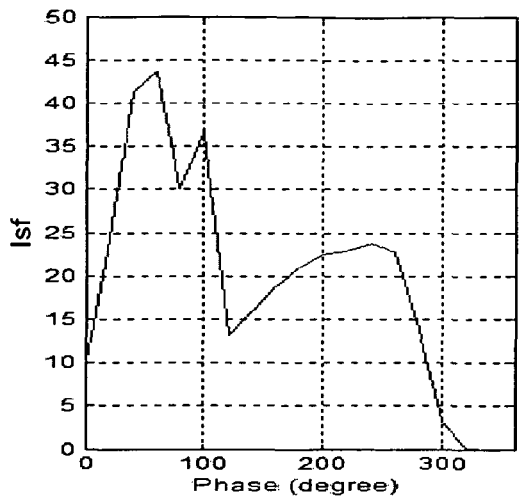

FIGS. 3-4 show exemplary plots relating to the bias voltage and current, respectively, observed during operation of the mirror arrangement shown in FIG. 2. In particular, FIG. 3 shows exemplary voltage differences (ΔV) between the collector voltage ($V_{mirror}$) and the base voltage ($V_b$) of mirror transistor 102 plotted over phase. FIG. 4 shows the bias current ($I_{sf}$) flowing out of follower amplifier 108 to base bias feed node 148, again plotted over phase. In each of FIGS. 3-4, values are plotted so that the horizontal axis represents operation at various phases of the Smith chart, as indicated by circle 55 in FIG. 1. That is, 360 degrees (and zero degrees) in FIGS. 3-4 generally corresponds to operation at point 56 in FIG. 1, whereas 180 degrees in FIGS. 3-6 generally corresponds to point 54 in FIG. 1. Intervening "phases" plotted from left to right in FIG. 3-4 therefore represent operation traversing circle 55 of FIG. 1 in a counter-clockwise manner.

As can be seen from FIGS. 3 and 4, when the bias current ($I_{sf}$) approaches zero (e.g., from about 330-360 degrees in FIG. 3), the voltage difference between the collector and base of mirror transistor 102 also approaches zero. That is, as avalanche currents begin to negate the current supplied by the bias network to the base of mirror transistor 102, the bias voltage applied across transistor 102 approaches zero, therefore shutting down operation of the mirror transistor 102 and follower amplifier 108. The bias network therefore undesirably appears as a high impedance to the power transistor 104 during such conditions. Stated another way, as the current shown in FIG. 4 approaches zero, control of the current mirror arrangement in FIG. 2 is largely lost.

With reference again to FIG. 2, the overall impedance of the bias network (as seen from power transistor 104) can be significantly reduced, particularly during times in which reduced impedance is most beneficial, by providing a current sink feature as described herein. If no other exit path is available for avalanche currents continuing to flow in transistor 104, transistor 104 may very rapidly reach its breakdown conditions, thereby resulting in damage to the device. When avalanche currents 144 are produced in transistor 104, then, it is desirable to keep the current mirror formed by transistors 102, 104 and 108 operating, since breakdown occurs only when current flow in the mirror ceases. This can be accomplished by maintaining the bias current provided to the base of mirror transistor 102 even during avalanche conditions. Bias current can be maintained, for example, by providing a current sink from the base bias feed node 148 during avalanche conditions.

Base bias feed node 148 is any node that is commonly coupled to the base junctions of mirror transistor 102 and one or more power transistors 104 to permit operation of a current mirror circuit. In the exemplary circuit shown in FIG. 2, node 148 is shown directly connected to the base of mirror transistor 102, and coupled to the base of power transistor 104 through an inductor 106, which may be provided as a convenient RF choke or the like. For at least direct current (DC) analysis, however, node 148 may be considered to be directly connected to the base of power transistor 104 as well. Because node 148 has the same DC characteristics as the base junctions of transistors 102 and 104, it may be considered a common node as the base of transistor 104 for purposes of the current mirror and the disposition of avalanche currents, even though RF choke inductor 106 and/or other components may be physically present. Base ballast impedances may also be provided (e.g., in embodiments wherein transistors 102 and 104 are implemented in gallium arsenide) on either side of the base bias feed node 148, as described more fully below.

A current sink is any device, circuit, component or path that allows current to exit amplifier circuit 100. FIG. 2 shows two different types of current sink elements, including a simple shunt resistor 115 and a more complex variable impedance 118 with external control. In a practical embodiment, only one current sink may be present. Each of the current sink elements shown in FIG. 2 are generally shown as coupling the base bias feed node 148 to an electrical ground or other reference, although other embodiments may be alternately coupled to any other reference signal, and/or may sink current to any other appropriate node. Many types of current sinks could be formulated and deployed in any number of alternate but equivalent embodiments.

In a simple embodiment, the current sink from base bias feed node 148 is simply a resistor 115 or other suitable impedance coupled between base bias feed node 148 and a ground or other reference. The amount of impedance provided will vary greatly from embodiment to embodiment, but may generally be relatively large with respect to the impedance of transistors 102 and 104 to minimize effects upon the current mirror. Since a static impedance such as resistor 115 would be electrically present during most, if not all, operating modes of the device, some current from base node 148 would typically flow through the resistance even when avalanche currents are not present, thereby potentially adversely affecting the battery life of the device. Nevertheless, if a large avalanche current were provided to base bias feed node 148, the path provided by resistor 115 would provide an avenue for such current to exit circuit 100 without overwhelming the bias current 146 applied at mirror transistor 102.

Another exemplary current sink is provided by a variable impedance, such as a transistor 118, in conjunction with control circuitry 120/124. Generally speaking, the variable impedance may be maintained to be relatively high (e.g. an open circuit) during normal operation. The variable impedance may be reduced (e.g., to a near short-circuit condition) as avalanche currents appear at base bias feed node 148 to keep follower amplifier 108 operational, and thereby keep the current mirror operating. In a further embodiment, variable impedance 118 may be controlled with greater precision to provide a proper amount of impedance based upon the operating conditions of the device, as described more fully below.

Variable impedance 118 is any type of variable resistance, inductance, capacitance or the like that is capable of being adjusted for different operating conditions. In the embodiment shown in FIG. 2, for example, variable impedance 118 is a transistor such as an NMOS FET or the like, although alternate embodiments may be formulated with any sort of bipolar, field effect or other transistor. In some embodiments, variable impedance 118 is the same type of device as follower amplifier 108, such as an NMOS FET or the like, to allow convenient tracking of the current ($I_{sf}$) through follower amplifier 108.

Control circuitry 120 is any sort of digital or analog circuitry, software and/or other logic capable of providing an enable signal 122 that results in a change in variable impedance 118. In various embodiments, enable signal 122 is produced by digital control circuitry 120 operating under the direction of software (or firmware) instructions. One example of a method for operating the amplifier circuit 100 is described below in conjunction with FIG. 7; such techniques may be at least partially implemented using software logic. Alternatively, conventional digital or analog comparator logic may be used to create a suitable enable signal 122 or to otherwise produce desired results with variable impedance 118.

Generally speaking, it is desirable to maintain a relatively high value of variable impedance 118 during normal operation, and to reduce the variable impedance 118 during avalanche conditions. "Avalanche conditions" in this sense may refer to actual avalanche conditions (e.g., the actual presence of avalanche current) and/or conditions wherein a substantial likelihood exists of avalanche currents occurring. Such conditions may be identified in any manner. For example, various embodiments may identify when avalanche conditions may be present by circuitry 120 suitably obtaining data 130 about the operating mode of the handset or other device. Measured voltages or other electrical signals may also be relevant. In the embodiment shown in FIG. 2, for example, circuitry 120 receives an indication of a battery voltage 128 and/or a detected voltage 127 as appropriate. Detected voltage 127 is typically an indication of output power of amplifier circuit 100, which may be received from a detector diode or other component using conventional techniques. Battery voltage simply indicates the voltage currently provided by the device battery (e.g., on the order of four volts or so). A regulated voltage 126 (which is typically a relatively constant scaled value powered by the battery or any other source) may also be provided to aid circuitry 120 in performing comparisons, forming bias signals 125 and/or the like. These various voltage indicia may be provided in any analog or digital form; analog signals may be digitized either outside or within control circuitry 120, for example, or control circuitry 120 may simply process the analog signals using conventional comparator circuitry or other constructs as appropriate.

Control circuitry 120 therefore identifies avalanche conditions based upon available information. In an exemplary embodiment, avalanche conditions may exist when the battery voltage 128 is relatively high (e.g., greater than about 3.7 volts or so), when the detected voltage 127 is relatively high (e.g., greater than about 1.5 volts or so), and/or when the device is in a high power mode as indicated by mode signals 130. For example, signals 130 may provide a digital (or other) indication when the device is operating in GSM mode rather than EDGE mode, since GSM mode typically involves higher power operation. That is, operation in EDGE mode poses a lesser threat of avalanche currents. Similarly, the device may operate in either a high power or low power mode; the low power mode may pose a lesser threat of avalanche currents as well. The threshold values provided herein are purely exemplary, and may vary significantly in other embodiments. Moreover, additional or alternate criteria for identifying avalanche conditions may be provided. As a result, avalanche conditions may be identified in any manner.

When avalanche conditions are identified, an enable signal 122 is provided to adjust the variable impedance. In some embodiments, enable signal 122 is a digital signal that may be provided directly to the gate or base terminal of a transistor acting as variable impedance 118. In other embodiments, enable signal 122 is a control signal provided to a bias signal generator 124. Bias signal generator 124 suitably provides an appropriately-scaled bias signal 125 to the base or gate of variable impedance 118. This scaled bias signal 125, in turn, places variable impedance 118 into the desired operating state to produce a desired amount of current flow 152 through the variable impedance 118. As noted above and below, when avalanche conditions are identified, it is generally desirable to preserve the proper bias current 146 provided to mirror transistor 102, which in turn keeps follower amplifier 108 and the rest of the current mirror operating, even when avalanche currents are present.

Various other features may also be provided in system 100. For example, a combination of transistor 114 and resistor 116 may be provided to improve the output linearity of power transistor 104, particularly under pre-avalanche conditions. In this example, the base junction of pre-avalanche transistor 114 is coupled to the base bias feed node 148 via resistor 116. As an avalanche current (or other large current) begins to appear at base bias feed node 148, the signal applied at the base of transistor 114 becomes large relative to the threshold voltage of the device, thereby switching on transistor 114 and providing a relatively low impedance path to ground (or another suitable node). This current sink would draw relatively little current away from the mirror during typical operation (e.g., when transistor 114 is in a high impedance state), yet could conduct additional amounts of current when conditions warrant. By selecting an appropriately large value for resistor 116, then, the effect upon output power can be limited during normal operation, yet effective sinking of pre-avalanche current can take place when conditions warrant.

Resistors 134 and 136 in FIG. 2 represent impedances that can be used to improve the short circuit operation ($V_{ces}$) of transistor 104. As noted above, $V_{ces}$ operation (corresponding to point 54 in FIG. 1) is typically a high-current condition, so an additional ballast impedance such as resistor 134 can be provided to prevent damage to device 104. Conventional Gummel sweeps, which are well-known, can be used to determine the appropriate size of resistor 134 for a particular implementation. Resistor 136 is typically matched to resistor 134 (compensating for the mirror ratio between transistors 102 and 104) to ensure proper mirroring. While FIG. 2 shows resistors 134 and 136 coupled to the emitter junctions of transistors 104 and 102, respectively, ballast may be alternatively (or additionally) applied to the base junctions of the transistors. In embodiments wherein transistors 102 and 104 are formed from gallium arsenide, for example, the larger operating voltages (in comparison to silicon devices) may warrant base ballasting in place of (or in addition to) emitter biasing.

As noted above, FIGS. 3-6 show exemplary voltage and current characteristics plotted when the current sink is active (FIGS. 5-6) and inactive (FIGS. 3-4). In each of FIGS. 3-6, values are plotted so that the horizontal axis represents operation at various phases of the Smith chart, as indicated by circle 55 in FIG. 1. While the particular values expressed in each of the FIGS. 3-6 are purely exemplary, comparing operation between the various plots demonstrates the root cause of device breakdown due to avalanche current, as well as an appropriate resolution of the issue.

Figure 5:
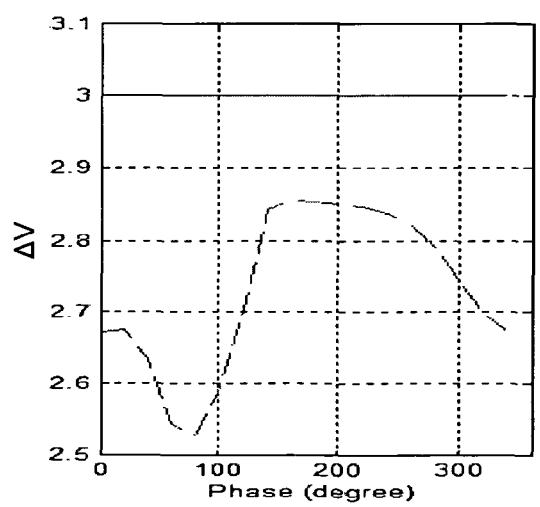
FIGS. 5 and 6 are plots of exemplary voltage and current characteristics, respectfully, observed with current sinking.
Figure 6:
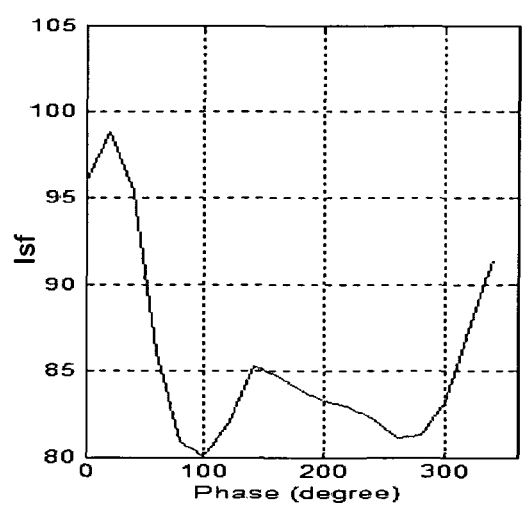

Like FIG. 3, FIG. 5 shows exemplary voltage differences ($\Delta V$) between the collector voltage ($V_{mirror}$) and the base voltage ($V_b$) of mirror transistor 102 (FIG. 2) plotted over phase. FIG. 6, like FIG. 4, shows the bias current ($I_{sf}$) flowing out of follower amplifier 108 to base bias feed node 148 (FIG. 2). FIGS. 5-6 show results corresponding to those of FIGS. 3-4, respectively, but with a current sink activated to reduce the impedance of the bias network at appropriate times.

By comparing FIG. 3 to FIG. 5 and FIG. 4 to FIG. 6, the benefits of current sinking can be readily observed. As can be seen from FIG. 6, the bias current resulting when the current sink is active remains above about 80 milliamps at all times in this example, thereby ensuring that bias current is continually provided to maintain operation of the current mirror. Similarly, the voltage difference shown in FIG. 5 remains non-zero across the operating range, indicating that bias network remains a relatively low impedance at all times in this example. Hence, the current sink is able to maintain the bias current even during avalanche conditions, thereby providing for continued operation of the current mirror and effectively preventing device breakdown.

Figure 7:
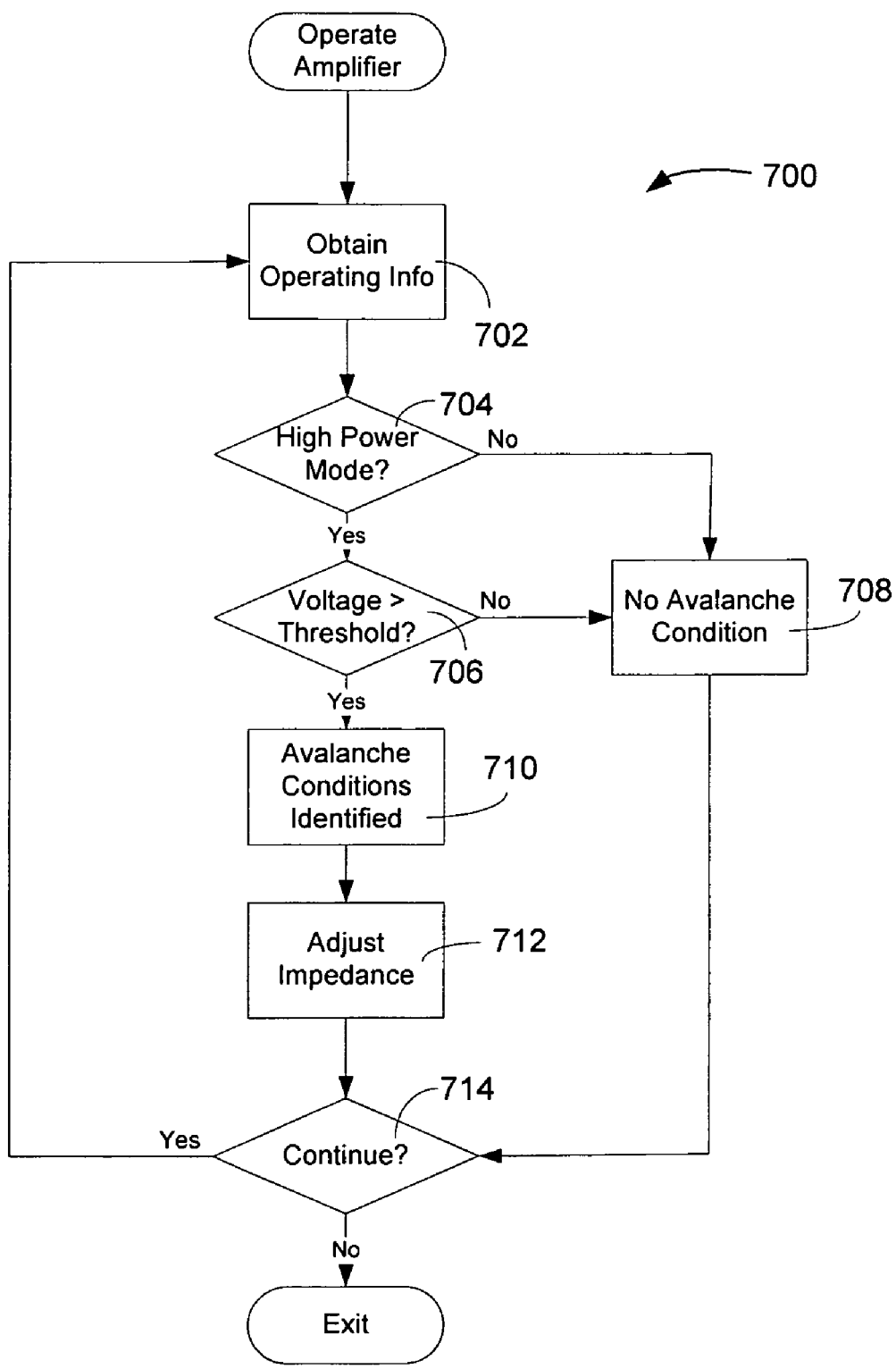
FIG. 7 is a flowchart of an exemplary method for operating a power amplifier in a device.

FIG. 7 shows an exemplary method 700 for operating a power amplifier 100 in a manner that avoids breakdown or other adverse effects resulting from avalanche current. As noted above, method 700 may be implemented in hardware, software, firmware or any combination thereof, including any combination of digital and analog circuitry. In various embodiments, method 700 may be implemented within control circuitry 120 (FIG. 2), although alternate embodiments may implement some or all of the steps of method 700 using other devices, circuitry, code, and/or other logic.

Generally speaking, method 700 involves the broad steps of obtaining information about the power amplifier (step 702), identifying avalanche conditions (step 710), and adjusting a variable impedance (step 712) to sink current while the avalanche conditions are identified. As noted above, this current sinking can maintain the proper bias current 146 provided to the mirror transistor 102, thereby keeping the current mirror operating even when avalanche conditions exist.

Beginning with step 702, operating information about power amplifier circuit 100 and/or the device utilizing circuit 100 is obtained in any manner. As noted above, such information may include any digital or analog indicia of battery voltage (e.g., voltage 128 in FIG. 2), detected voltage(s) (e.g., voltage 127 in FIG. 2), operating mode(s) of the device (e.g., signals 130 in FIG. 2), and/or other information as appropriate.

FIG. 7 shows two comparator steps 704, 706 for processing the operating information. In practice, additional or alternate steps may be provided depending on the types and amounts of operating information that may be available. For example, not all embodiments will need to consider both operating mode and measured voltage, but may rather consider only one factor or another, or different factors entirely. As shown in FIG. 7, however, process 700 involves determining whether or not the device is operating in a high power mode (step 704). This may occur, for example, by simply checking a status flag or other signal 130 received from a digital interface or the like. As noted above, some operating modes (e.g., EDGE mode) may be less susceptible to avalanche currents than other higher-power modes (e.g., GSM mode), so avalanche currents may be more likely to occur in the higher power modes. Moreover, additional higher or lower power modes may be available within one of the primary modes selected above (e.g., a high power GSM and low power GSM mode), and such information may be considered in determining whether avalanche conditions exist.

Similarly, one or more voltages, currents or other electrical values may be measured in any manner and compared to threshold values (step 706) to determine if the device is operating at relatively high power. If battery voltage 128 is low, for example, or the detected output 127 of the power amplifier is relatively low, then avalanche conditions may be unlikely to exist.

If no avalanche conditions exist (step 708), then the current sink is typically left in a relatively high impedance state to reduce the effect upon battery life of the device. Continued evaluation (step 714) of received data can proceed as new data is available or device operations change.

If avalanche conditions are identified (step 710) based upon the received operating information, however, then adjustments may be made to the current sink to ensure continued operation of the current mirror (step 712). Using any of the various concepts and structures described above, the variable impedance 118 may be adjusted to ensure that the bias network for the current mirror does not go to a high impedance condition. By reducing the impedance between the base bias feed node 148 (FIG. 2) and ground (or any other suitable reference), for example, the overall impedance of the bias network can be reduced. Any of the various current sinks present between base node 148 and ground in FIG. 2, for example, provide a path for avalanche current 144 to leave the amplifier circuit 100 and thereby preserve the proper bias current 146 provided to the base of mirror transistor 102. This, in turn, keeps mirror transistor 102 and follower amplifier 108 operating, thereby maintaining the operation of the current mirror even in the face of avalanche currents.

Various systems, techniques and structures have therefore been described to prevent adverse effects resulting from relatively high VSWR operation of power amplifiers. By providing a current sink that is able to remove some or all of the avalanche current produced, the bias to the current mirror used in the power amplifier can be preserved, and mirror operation can continue into operating parameters that were not previously thought to be possible. In particular, BJT and HBT devices may now be incorporated into power amplifier designs that were previously thought to be impractical. Stated another way, the ruggedness of BJT, HBT and other types of transistor amplifiers has been greatly improved by addressing the root cause of device burnout resulting from avalanche currents. Systems, devices, and methods may therefore be configured in accordance with many different exemplary embodiments.

In one embodiment, an amplifier circuit is provided that comprises a power transistor having a base terminal and a mirror transistor having a collector terminal and a base terminal, wherein the base terminal is coupled to the collector terminal of the mirror transistor to thereby receive a bias current, and wherein the base terminal is also coupled to the base terminal of the power transistor to thereby form a base bias feed node. A current sink is coupled to the base bias feed node and configured to sink current at least during avalanche conditions and thereby maintain the bias current at the base terminal of the mirror transistor at a level that continues operation of the mirror transistor while the avalanche conditions exist.

This amplifier circuit may be modified, enhanced and/or more fully defined in many different ways. For example, the current sink may comprise control circuitry configured to identify the avalanche conditions and to generate an enable signal in response thereto, and a variable resistance coupled to the base bias feed node that is configured to vary an electrical resistance in response to the enable signal. The avalanche conditions may comprise conditions wherein avalanche currents are likely to occur. The variable resistance may comprise a field effect transistor, which may be matched to a second field effect transistor configured as a follower amplifier and located between the collector terminal and the base terminal of the mirror transistor. The current sink may comprise an impedance electrically coupling the base bias feed node to a reference, which may be an electrical ground. The amplifier circuit may comprise a pre-avalanche transistor coupled between the base bias feed node and a reference voltage. The base junction of the pre-avalanche transistor may be coupled to the common base node, and the current sink may further comprise an impedance between the base bias feed node and the base junction of the sink transistor. The amplifier circuit may further comprise control circuitry configured to identify the avalanche conditions and to enable the current sink while the avalanche conditions are present. The control circuitry may be further configured to disable the current sink while the avalanche conditions are not present. The power transistor and mirror transistors may be heterojunction bipolar transistors.

In other embodiments, an amplifier circuit comprises a mirror transistor comprising a collector terminal and a first base terminal. A follower amplifier is provided with a gate terminal coupled to the collector terminal of the mirror transistor and a semiconducting channel configured to supply a bias current to the first base terminal of the mirror transistor in response to an electrical signal applied at the gate terminal. A power transistor comprising a second base terminal is coupled to the first base terminal of the mirror transistor to thereby form a base bias feed node. Control circuitry is configured to identify avalanche conditions during operation of the amplifier circuit and to generate a control signal in response thereto, and a current sink is coupled to receive the control signal and having a variable impedance coupled to the base bias feed node, wherein the current sink is further configured to reduce the variable impedance in response to the control signal when avalanche conditions are identified, thereby sinking current flowing in the base bias feed node and maintaining the bias current at the base terminal of the mirror transistor to thereby continue operation of the mirror transistor while the avalanche conditions exist.

This amplifier circuit may be modified, enhanced and/or more fully defined in many different ways. For example, the variable impedance may be a second field effect transistor matched to the field effect transistor of the follower amplifier. The control circuitry may be configured to identify the avalanche conditions based at least in part upon an operating mode of a device comprising the amplifier circuit. The control circuitry may be configured to identify the avalanche conditions based at least in part upon a detected voltage based upon an output of the power transistor.

In still other embodiments, a method of operating a power amplifier in a device is provided, wherein the power amplifier comprises a plurality of transistors configured as a current mirror with a base bias feed node. Operating information about the power amplifier is obtained, and actual and/or possible avalanche conditions are identified from the operating information. A variable impedance coupling the common base node to a reference node is adjusted to thereby sink current from the base bias feed node to the reference node while avalanche conditions are identified.

This basic technique may be modified, enhanced and/or more fully defined in many ways. For example, the operating information may comprise an operating mode for the device, and the identifying may comprise determining whether the operating mode indicates a high-power mode. The operating information may comprise a detected electrical signal based upon an output of the power amplifier, and wherein the identifying comprises comparing the detected electrical signal to a threshold level. The variable impedance may be a current sink transistor, and the adjusting may comprise generating a control signal for the current sink transistor. The identifying may comprise identifying conditions wherein avalanche currents are likely.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An amplifier circuit comprising:
   a power transistor having a base terminal;
   a mirror transistor having a collector terminal and a base terminal, wherein the base terminal is coupled to the collector terminal of the mirror transistor to thereby receive a bias current, and wherein the base terminal is also coupled to the base terminal of the power transistor to thereby form a base bias feed node;
   control circuitry configured to identify avalanche conditions during operation of the amplifier circuit and to generate a control signal in response thereto; and a current sink coupled to the base bias feed node and configured to sink current flowing in the base bias feed node in response to the control signal at least during the avalanche conditions and thereby maintain the bias current at the base terminal of the mirror transistor at a level that continues operation of the mirror transistor while the avalanche conditions exist.

2. The amplifier circuit of claim 1 wherein the current sink comprises an impedance electrically coupling the base bias feed node to a reference.

3. The amplifier circuit of claim 2 wherein the reference is an electrical ground.

4. The amplifier circuit of claim 1 wherein the power transistor and mirror transistors are heterojunction bipolar transistors.

5. The amplifier circuit of claim 4 wherein the control circuitry is configured to identify the avalanche conditions based at least in part upon a detected voltage based upon an output of the power transistor.

6. The amplifier circuit of claim 1, wherein the control circuitry is further configured to receive one or more informational inputs that are used to identify the avalanche conditions, wherein the informational inputs are selected from a group consisting of: data about an operating mode of a device within which the amplifier circuit is implemented; an indication of whether the device is operating in a GSM mode; an indication of whether the device is operating in an EDGE mode; an indication of a battery voltage; an indication of output power of the amplifier circuit; and a regulated voltage.

7. An amplifier circuit comprising:
a power transistor having a base terminal;
a mirror transistor having a collector terminal and a base terminal, wherein the base terminal is coupled to the collector terminal of the mirror transistor to thereby receive a bias current, and wherein the base terminal is also coupled to the base terminal of the power transistor to thereby form a base bias feed node; and
a current sink coupled to the base bias feed node and configured to sink current at least during avalanche conditions and thereby maintain the bias current at the base terminal of the mirror transistor at a level that continues operation of the mirror transistor while the avalanche conditions exist, wherein the current sink comprises:
control circuitry configured to identify the avalanche conditions and to generate an enable signal in response thereto; and
a variable resistance coupled to the base bias feed node that is configured to vary an electrical resistance in response to the enable signal.

8. The amplifier circuit of claim 7 wherein the avalanche conditions comprise conditions wherein avalanche currents are likely to occur.

9. The amplifier circuit of claim 7 wherein the variable resistance comprises a field effect transistor.

10. The amplifier circuit of claim 9 wherein the field effect transistor is matched to a second field effect transistor configured as a follower amplifier and located between the collector terminal and the base terminal of the mirror transistor.

11. An amplifier circuit comprising:
a power transistor having a base terminal;
a mirror transistor having a collector terminal and a base terminal, wherein the base terminal is coupled to the collector terminal of the mirror transistor to thereby receive a bias current, and wherein the base terminal is also coupled to the base terminal of the power transistor to thereby form a base bias feed node;

a current sink coupled to the base bias feed node and configured to sink current at least during avalanche conditions and thereby maintain the bias current at the base terminal of the mirror transistor at a level that continues operation of the mirror transistor while the avalanche conditions exist; and
a pre-avalanche transistor coupled between the base bias feed node and a reference voltage.

12. The amplifier circuit of claim 11 wherein a base junction of the pre-avalanche transistor is coupled to the base bias feed node.

13. The amplifier circuit of claim 12 wherein the current sink further comprises an impedance between the base bias feed node and the base junction of the sink transistor.

14. An amplifier circuit comprising:
a power transistor having a base terminal;
a mirror transistor having a collector terminal and a base terminal, wherein the base terminal is coupled to the collector terminal of the mirror transistor to thereby receive a bias current, and wherein the base terminal is also coupled to the base terminal of the power transistor to thereby form a base bias feed node;
a current sink coupled to the base bias feed node and configured to sink current at least during avalanche conditions and thereby maintain the bias current at the base terminal of the mirror transistor at a level that continues operation of the mirror transistor while the avalanche conditions exist; and
control circuitry configured to identify the avalanche conditions and to enable the current sink while the avalanche conditions are present.

15. The amplifier circuit of claim 14 wherein the control circuitry is further configured to disable the current sink while the avalanche conditions are not present.

16. An amplifier circuit comprising:
a mirror transistor comprising a collector terminal and a first base terminal;
a follower amplifier having a gate terminal coupled to the collector terminal of the mirror transistor and a semiconducting channel configured to supply a bias current to the first base terminal of the mirror transistor in response to an electrical signal applied at the gate terminal;
a power transistor comprising a second base terminal coupled to the first base terminal of the mirror transistor to thereby form a base bias feed node;
control circuitry configured to identify avalanche conditions during operation of the amplifier circuit and to generate a control signal in response thereto; and
a current sink coupled to receive the control signal and having a variable impedance coupled to the base bias feed node, wherein the current sink is further configured to reduce the variable impedance in response to the control signal when avalanche conditions are identified, thereby sinking current flowing in the base bias feed node and maintaining the bias current at the base terminal of the mirror transistor to thereby continue operation of the mirror transistor while the avalanche conditions exist.

17. The amplifier circuit of claim 16 wherein the variable impedance is a second field effect transistor matched to the field effect transistor of the follower amplifier.

18. The amplifier circuit of claim 16 wherein the control circuitry is configured to identify the avalanche conditions based at least in part upon an operating mode of a device comprising the amplifier circuit.

19. A method of operating a power amplifier in a device, wherein the power amplifier comprises a plurality of transistors configured as a current mirror with a base bias feed node, the method comprising:
- obtaining operating information about the power amplifier;
- identifying avalanche conditions from the operating information; and
- adjusting a variable impedance coupling the base bias feed node to a reference node to thereby sink current from the base bias feed node to the reference node while avalanche conditions are identified.

20. The method of claim 19 wherein the operating information comprises an operating mode for the device, and wherein the identifying comprises determining whether the operating mode indicates a high-power mode.

21. The method of claim 19 wherein the operating information comprises a detected electrical signal based upon an output of the power amplifier, and wherein the identifying comprises comparing the detected electrical signal to a threshold level.

22. The method of claim 20 wherein the variable impedance is a current sink transistor, and wherein the adjusting comprises generating a control signal for the current sink transistor.

23. The method of claim 19 wherein the identifying comprises identifying conditions wherein avalanche currents are likely.

* * * * *